310-10 SR
F213A XR 3,361,940

Jan. 2, 1968 W. H. CULVER ET AL 3,361,940

PROCESS OF FORMING A SUPER-CONDUCTIVE MAGNETIC SHIELD

Original Filed Sept. 29, 1959

INVENTORS
WILLIAM H. CULVER
MILFORD H. DAVIS
BY Zulwider, Patton, Rieber
Lee, and Utecht
ATTORNEYS

United States Patent Office 3,361,940
Patented Jan. 2, 1968

3,361,940

PROCESS OF FORMING A SUPER-CONDUCTIVE MAGNETIC SHIELD

William H. Culver, Washington, D.C., and Milford H. Davis, Santa Monica, Calif., assignors to The Rand Corporation, Santa Monica, Calif., a non-profit corporation of California

Original application Sept. 29, 1959, Ser. No. 843,906. Divided and this application Sept. 28, 1964, Ser. No. 399,779

7 Claims. (Cl. 317—123)

ABSTRACT OF THE DISCLOSURE

A process of providing a superconductive magnetic shield devoid of substantial trapped magnetic flux to provide a region therein substantially free of magnetic fields. A space enclosing shield is formed of or clad with a material which becomes superconducting when cooled below a predetermined temperature, such as lead or niobium, and the shield is cooled below the superconducting transition temperature of its material to minimize trapping magnetic flux therein, in several ways. One manner of carrying out the process is by zone cooling in which the shield is first cooled to superconductivity at one point and this cooling and superconductivity spread from that point to prevent the formation of warmer areas, not superconducting, and containing magnetic flux, surrounded by superconducting areas. The shield after being cooled to its superconducting condition may be expanded to provide a much larger size shielded volume to further minimize magnetic flux therein. The shield may be formed of a plurality of similar parts and after cooling to the superconducting condition, the parts may be separated and reassembled in different relative positions while being maintained below their superconducting transition temperature. In addition, the process may be carried out with respect to a plurality of shields of a size and shape to fit one within another, wherein the larger shield is cooled below its superconducting transition temperature as previously described, and then the next smaller shield is positioned within the larger shield and thereafter cooled below its superconducting transition temperature while being shielded by the larger shield. As a further refinement of the process, the inner shield may be moved relative to the outer shield as the inner shield is being cooled.

The present invention is directed to a process for providing a superconductive magnetic shield devoid of substantial trapped magnetic flux to provide a region substantially free of magnetic fields. While such superconductive magnetic shields are usable anywhere a region is desired substantially free of magnetic fields, they are particularly useful in forming in such regions superconductive elements with a minimum of trapped magnetic flux.

This application is a division of our application Ser. No. 843,906, filed Sept. 29, 1959, for Superconducting Gyroscopic Apparatus, now Patent No. 3,216,263.

If various metallic elements and compounds are cooled to temperatures of a few degrees Kelvin, their electrical conductivity becomes infinite. Several elements and numerous alloys possess this property, which generally occurs at a superconducting transition temperature of around 5° Kelvin. Metals in a superconducting state expel all magnetic fields and have zero magnetic permeability. However, a magnetic field of sufficient intensity will destroy the superconducting properties of the metal body. That is, superconducting bodies expel all magnetic fields which are below a certain intensity.

It is difficult to cool a body through the superconducting transition temperature so uniformly that all the material becomes superconducting at the same time. A condition may exist where connected regions within the body are superconducting while the remainder of the material of the body is non-superconducting. In a very thin slab of material such a condition might be described as islands of non-superconducting material surrounded by superconducting regions. Any ambient magnetic field present when the body was still warmer than the superconducting transition temperature will remain in the non-superconducting regions, if these exist when the body is cooled through the transition temperature. As a non-superconducting island or area becomes smaller with increased cooling of the body, the magnetic field contained in the island is reduced in cross-section and therefore becomes more intense. Finally, this trapped magnetic field of flux is pushed into a small area which cannot be made superconducting because of the resultant intensity of the magnetic field. Therefore, minimizing the trapped magnetic flux in a superconducting body presents a serious problem.

It will be apparent that the trapped magnetic flux in a superconducting body will be lessened if the body is cooled through the superconducting transition temperature in a region free of magnetic fields and one object of the present invention is the provision of a new and improved process of forming a magnetic shield providing such a magnetic field-free region.

Another object of this invention is a new and improved process wherein superconductive elements are employed to produce a superconducting magnetic shield providing a region substantially free of magnetic fields.

These and other objects and features of the present invention will be apparent to those skilled in the art from the following specification and the appended drawings, in which.

Magnetic field-free regions are useful in many applications, of which an example is the provision of a superconducting body with a minimal amount of trapped magnetic flux by cooling the bdy through the superconducting transition temperature while it is disposed in the magnetic field-free region.

In providing a magnetic field-free region, i.e., a region with a minimal amount of magnetic flux, a superconducting shield may be employed. Of course, the super- itself or such flux will pass through the region surrounded conducting shield must contain very little trapped flux by the shield to impair its field-free character. The formation of a superconducting shield containing very little trapped magnetic flux so as to enclose a region with a minimal amount of magnetic flux may desirably include zone cooling in which the shield is first cooled to superconductivity at one point and this cooling and superconductivity spread from that point to prevent the formation of warmer areas, not superconducting and containing magnetic flux, surrounded by superconducting areas. This zone cooling may be effected either by careful temperature control or alternatively by forming the shield of material which possesses a gradient in its property of superconducting transition temperature.

Figure 1:
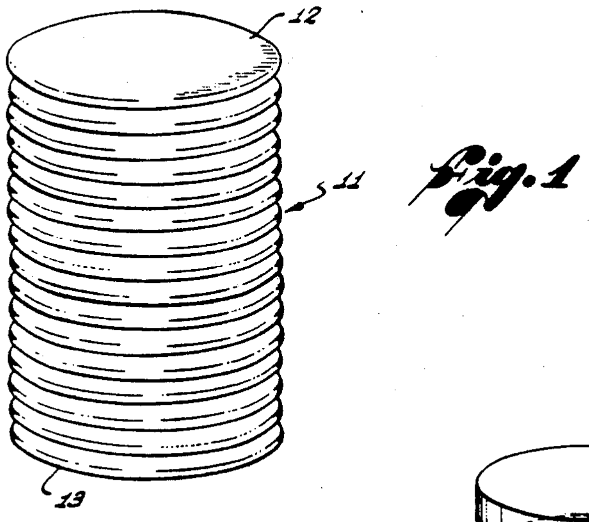
FIGURE 1 is a perspective view of an apparatus usable in the process according to the present invention for providing a magnetic shield.

Considering the structure of a shield in which the process according to the present invention may be employed, one form thereof is illustrated in FIGURE 1 as comprising a closed cylindrical bellows 11 having opposite end walls 12 and 13 to which force may be applied to compress the bellows 11 to enclose a relatively small space or region. The bellows 11 may then be cooled below the superconducting transition temperature while enclosing this small space and thereafter the bellows may be expanded by separating the end walls 12 and 13 to provide a much larger size shielded volume or region.

The bellows 11 is, of course, formed of or clad with superconductive material, such as lead or niobium, and is cooled below the superconducting transition temperature in a magnetically shielded space which may be provided within another superconducting magnetic shield. For example, the magnetic shield of FIGURE 1 may be cooled to a superconducting state while being shielded by the shield structure of FIGURE 2 or vice versa.

Figures 2, 3:
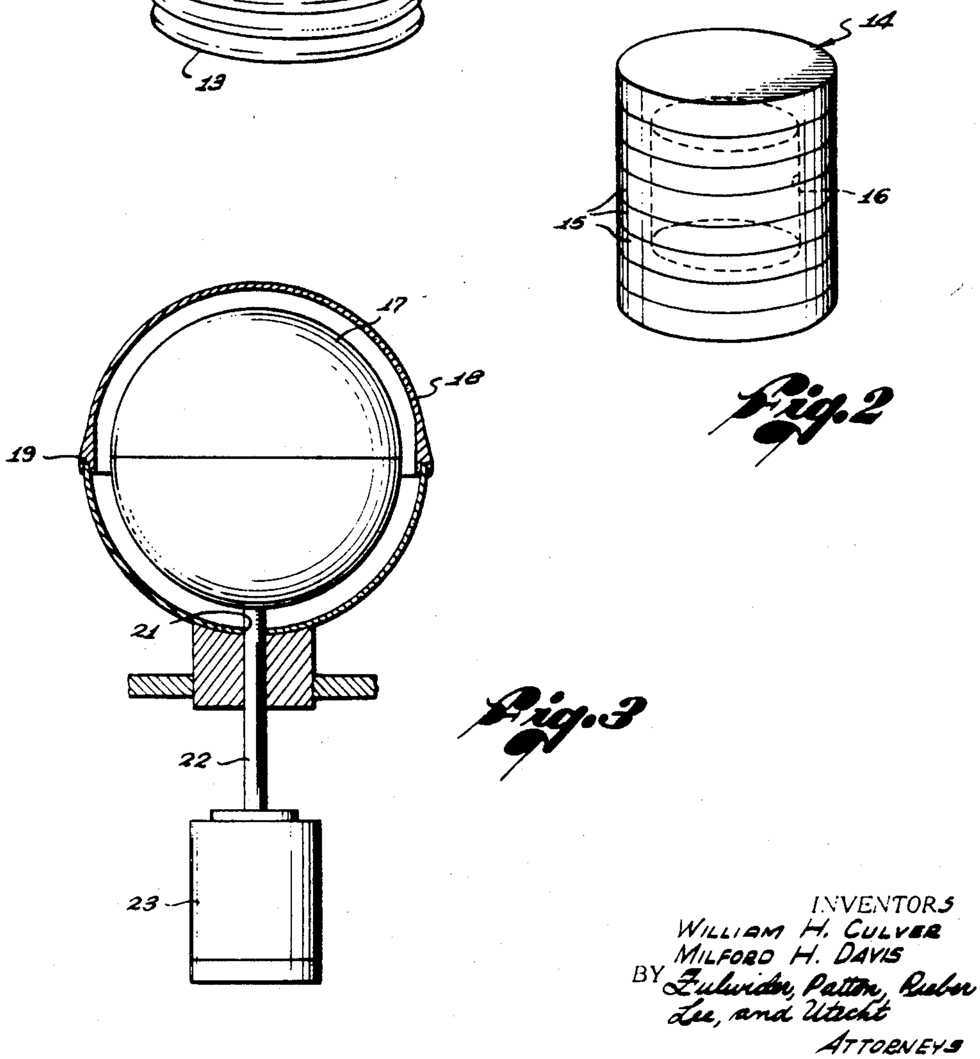
FIGURE 2 is a perspective view of another apparatus usable in the process according to the present invention for providing a magnetic shield.
FIGURE 3 is a perspective view of still another apparatus usable in the process according to the present invention for providing a magnetic shield.

The shield of FIGURE 2 comprises a stack 14 of discs 15 of superconductive material. The central discs have central apertures therethrough while the end discs are solid. As a result, a cylindrical cavity 16 exisst within the stack 14. Cooling the stack 14 below the superconducting transition temperature in a space somewhat free of magnetic flux may still allow some fields to be trapped in the stack. However, thereafter the discs 15 are separated and randomly rearranged with the result that any trapped flux is reduced and distributed. In this condition the shield of FIGURE 2 may receive the shield of FIGURE 1 so that the latter may be cooled in a relatively flux-free space in the cavity 16 and thereby contain less trapped flux.

This process of magnetically shielding a shield structure during cooling by employing a superconducting shield thereabout may be repeatedly performed to obtain a final superconducting shield or other body containing very little trapped flux.

A structure which is useful in such a repetitive operation is shown in FIGURE 3 which also incorporates means for moving an inner body or shield relative to an outer body or shield whereby to further reduce trapped flux in the inner body. A plurality of concentric shells of superconductive material capable of fitting in one another are provided, an inner shell 17 and an outer shell 18 being illustrated in FIGURE 3. Each of the shells has two hemispherical parts which are joined at grooved joints such as illustrated at 19 in the section through the outer shell 18. The lower hemisphere of the outer shell 18 has a bore 21 therethrough through which a shaft 22 passes to be connected to the lower hemisphere of the inner shell 17. The shaft 22 is connected to a motor 23 for rotating the inner shell 17 within the outer shell 18.

In the process according to the present invention as applied to the structure of FIGURE 3, the external shell 18 is first cooled below the superconducting transition temperature with minimal trapped magnetic flux under the conditions existing in the region in which it is cooled. The shell 18 is then opened by separating the hemispheres thereof at the joint 19 and the shell 17 is placed therein and mounted on the end of the shaft 22. the shell 17 being at this time cooled to a temperature only slightly above the superconducting transition temperature of its material and with the shell 18 being maintained below its transition temperature. The motor 23 is then energized to rotate the shell 17 relative to the outer shell 18 and the shell 17 is further cooled, as by circulating liquid helium within the outer shell 18, to below the superconducting transition temperature of the material of shell 17. The relative motion between the shells 17 and 18 serves to expel some of the trapped flux from the shell 17. After the shell 17 has cooled below its superconducting transition temperature, the amount of flux trapped therein is less than the amount of flux trapped in the external shell 18.

Thereafter the shell 17 is employed as an external shell while another similar but smaller shell of superconductive material is placed concentrically within the shell 17 in the same way that the shell 17 was placed within the outer shell 18, and with the shaft 22 passing freely through the now stationary shell 17 while the shell therein is mounted on the shaft for rotation. The now innermost shell is cooled through its superconducting transition temperature and will product a resultant shell having less trapped flux than the shell 17. This operation may be repeated many times to eventually produce a shell which contains exceedingly small amounts of trapped flux. The ultimate shell produced in this manner may then be employed for whatever purpose a magnetic field-free region provided therein is desired, for example, to produce a superconducting body within the ultimate shell which will have a minimal amount of trapped magnetic flux therein.

While certain preferred processes of providing magnetic shields, and structures to which these processes may be applied, have been specifically illustrated and described herein, it will be understood that the invention is not limited thereto, as many variations will be apparent to those skilled in the art and the invention is to be given its broadest interpretation within the terms of the following claims.

We claim:

1. A process for providing a magnetic shield enclosing a region having a reduced magnetic field comprising the steps of: providing a shield of material which becomes superconducting when cooled below a predetermined temperature; zone cooling said shield below the superconducting transition temperature of its material whereby to minimize trapping magnetic flux therein; separating said shield into a plurality of similar parts after being cooled; and reassembling the shield with the parts in different relative positions while maintaining the parts below their superconducting transition temperature.

2. A process for providing a magnetic shield enclosing a region of reduced magnetic field comprising the steps of: forming a plurality of shields of material which becomes superconducting when cooled below a predetermined temperature, said shields being sized and shaped so as to be capable of being disposed within one another; cooling the larger of said shields below the superconducting transition temperature thereof; positioning the next smaller shield inside said larger of said shields; cooling said next smaller shield below the superconducting transition temperature thereof; and moving said next smaller shield relative to said larger shield as said next smaller shield is cooled.

3. A process for providing a magnetic shield enclosing a region of reduced magnetic field comprising the steps of: forming a plurality of shields of material which becomes superconducting when cooled below a predetermined temperature, said shields being sized and shaped so as to be capable of being disposed within one another; cooling the larger of said shields below the superconducting transition temperature thereof; positioning the next smaller shield inside said larger of said shields; and cooling said next smaller shield below the superconducting transition temperature thereof; said next smaller shield then being expanded after cooling thereof to provide an increased enclosed volume.

4. A process for providing a magnetic shield enclosing a region of reduced magnetic field comprising the steps of: forming a plurality of shields of material which becomes superconducting when cooled below a predetermined temperature, said shields being sized and shaped so as to be capable of being disposed within one another; cooling the larger of said shields below the superconducting transition temperature thereof; positioning the next smaller shield inside said larger of said shields; cooling said next smaller shield below the superconducting transition temperature thereof; at least one of said shields being dissected into a plurality of parts after being cooled and thereafter reassembled while being maintained below its superconducting transition temperature.

5. A process for providing a magnetic shield enclosing a region having a reduced magnetic field comprising the steps of: providing a shield of material which becomes superconducting when cooled below a predetermined temperature; and zone cooling said shield below the superconducting transition temperature of its material whereby to minimize trapping magnetic flux therein by first cooling the shielding to superconductivity at one point and spreading the cooling and superconductivity from that point throughout the shield while avoiding the formation of warmer areas, not superconducting and containing magnetic flux, surrounded by superconducting areas.

6. A process for providing a magnetic shield enclosing a region of reduced magnetic field comprising the steps of: forming a plurality of shields of material which becomes superconducting when cooled below a predetermined temperature, said shields being sized and shaped so as to be capable of being disposed within one another; first cooling the larger of said shields below the superconducting transition temperature thereof; positioning the next smaller shield inside said larger of said shields while maintaining the low temperature of the larger shield; and then cooling said next smaller shield below its superconducting transition temperature to minimize trapping magnetic flux therein.

7. A process according to claim 6 wherein said shields are zone cooled to minimize trapping magnetic flux therein by first cooling each shield to superconductivity at one point and spreading the cooling and superconductivity from that point throughout the shield while avoiding the formation of warmer areas, not superconducting and containing magnetic flux, surrounded by superconducting areas.

References Cited

UNITED STATES PATENTS

| | | | |
|---|---|---|---|
| 2,864,963 | 12/1958 | Dornstreich et al. | 336—84 X |
| 3,015,960 | 1/1962 | Steele | 317—158 X |

OTHER REFERENCES

Babiskin, Magnetic Properties of a Hollow Superconducting Lead Sphere, The Physical Review, vol. 85, No. 1, pp. 104–106, Jan. 1, 1952.

MILTON O. HIRSHFIELD, *Primary Examiner.*

J. A. SILVERMAN, *Assistant Examiner.*